United States Patent
Tsai et al.

(10) Patent No.: US 10,453,760 B2
(45) Date of Patent: Oct. 22, 2019

(54) LID ARRAY PANEL, PACKAGE WITH LID AND METHOD OF MAKING THE SAME

(71) Applicant: Advanced Semiconductor Engineering, Inc., Kaohsiung (TW)

(72) Inventors: Chang Chin Tsai, Kaohsiung (TW); Hsun-Wei Chan, Kaohsiung (TW)

(73) Assignee: ADVANCED SEMICONDUCTOR ENGINEERING, INC., Kaohsiung (TW)

(*) Notice: Subject to any disclaimer, the term of this patent is extended or adjusted under 35 U.S.C. 154(b) by 0 days.

(21) Appl. No.: 15/094,178

(22) Filed: Apr. 8, 2016

(65) Prior Publication Data

US 2017/0294361 A1    Oct. 12, 2017

(51) Int. Cl.
*H01L 23/32* (2006.01)
*H01L 21/78* (2006.01)
*H01L 23/053* (2006.01)
*H01L 21/48* (2006.01)
*H01L 21/50* (2006.01)

(52) U.S. Cl.
CPC ........ *H01L 23/053* (2013.01); *H01L 21/4803* (2013.01); *H01L 21/50* (2013.01); *H01L 21/78* (2013.01); *H01L 23/32* (2013.01)

(58) Field of Classification Search
CPC ....... H01L 23/05; H01L 23/053; H01L 23/32; H01L 21/52; H01L 21/78; H01L 21/48; H01L 21/48; H01L 21/4803; H01L 21/50
USPC .......................................... 257/704
See application file for complete search history.

(56) References Cited

U.S. PATENT DOCUMENTS

| 6,389,687 | B1 | 5/2002 | Glenn et al. | |
|---|---|---|---|---|
| 7,508,065 | B2* | 3/2009 | Sherrer | G02B 6/4201 257/704 |
| 2014/0077352 | A1* | 3/2014 | Leal | H01L 24/32 257/704 |

* cited by examiner

*Primary Examiner* — Monica D Harrison
(74) *Attorney, Agent, or Firm* — Foley & Lardner LLP; Cliff Z. Liu (57) ABSTRACT

A lid array panel includes multiple lids, where each lid includes an outer side wall. The lid array panel further includes a bridge section surrounding and attached to the outer side walls of the lids, where the lids are connected to each other by the bridge section, the lid array panel further includes a reinforcement attached to the bridge section. A package structure includes a carrier, a chip disposed on an upper surface of the carrier, a lid, a bridge section, and a reinforcement. The lid includes a top wall and an outer side wall, the top wall and the outer side wall of the lid together define a cavity, and the outer side wall of the lid is attached to the upper surface of the carrier. The bridge section surrounds, and is attached to, the outer side wall of the lid. The reinforcement is attached to the bridge section.

22 Claims, 13 Drawing Sheets

LID ARRAY PANEL, PACKAGE WITH LID AND METHOD OF MAKING THE SAME

BACKGROUND

1. Technical Field

The present disclosure relates to a lid array panel, a package with a lid and a method of making such a package.

2. Description of the Related Art

In some package structures, to prevent a chip (such as a sensor) from being damaged by the environment or contaminated by moisture and dust, the chip is encapsulated by a molding compound or covered by a lid. In some package structures, a lid array panel may be attached to a carrier (substrate) including multiple package units, and the carrier and panel together are sawn into individual package structures. However, warpage of the lid array panel can occur due to insufficient strength of the panel.

SUMMARY

In an aspect, a lid array panel includes multiple lids, where each lid includes an outer side wall. The lid array panel further includes a bridge section surrounding and attached to the outer side walls of the lids, where the lids are connected to each other by the bridge section, and the lid array panel further includes a reinforcement attached to the bridge section.

In an aspect, a package structure includes a carrier, a chip disposed on an upper surface of the carrier, a lid, a bridge section, and a reinforcement. The lid includes a top wall and an outer side wall, the top wall and the outer side wall of the lid together define a cavity, and the outer side wall of the lid is attached to the upper surface of the carrier. The bridge section surrounds, and is attached to, the outer side wall of the lid. The reinforcement is attached to the bridge section.

In an aspect, a method of making a package structure includes providing a lid array panel, where the lid array panel includes multiple lids, a bridge section, and a reinforcement; providing a carrier including a plurality of chips disposed at a surface of the carrier; attaching the lid array panel to the surface of the carrier such that each chip is covered by a corresponding lid and each lid defines a cavity with the carrier; and forming a plurality of package structures by singulation. Each lid includes at least one outer side wall. The bridge section surrounds, and is attached to, the outer side walls of the lids. The lids are connected to each other by the bridge section. The reinforcement is attached to the bridge section.

DETAILED DESCRIPTION

For a better understanding of the nature and objects of some embodiments of the present disclosure, reference should be made to the following detailed description taken in conjunction with the accompanying drawings. In the drawings, like reference numbers denote like elements, unless the context clearly dictates otherwise.

Spatial descriptions, such as "above," "below," "up," "left," "right," "down," "top," "bottom," "vertical," "horizontal," "side," "higher," "lower," "upper," "over," "under," and so forth, are indicated with respect to the orientation shown in the figures unless otherwise specified. It should be understood that the spatial descriptions used herein are for purposes of illustration only, and that practical implementations of the structures described herein can be spatially arranged in any orientation or manner, provided that the merits of embodiments of this disclosure are not deviated by such arrangement.

Figure 1A:
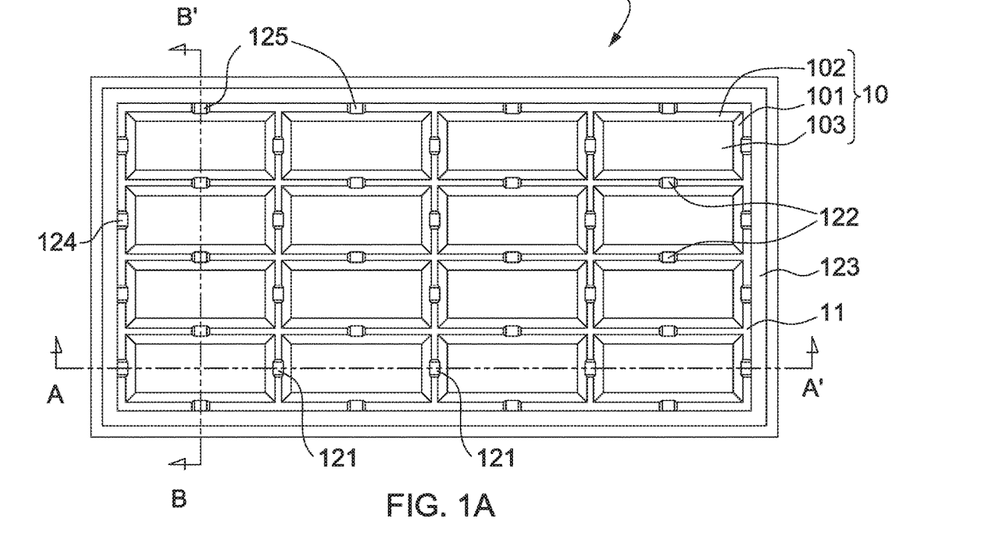
FIG. 1A illustrates a top view of a lid array panel according to an embodiment the present disclosure.
Figure 1B:
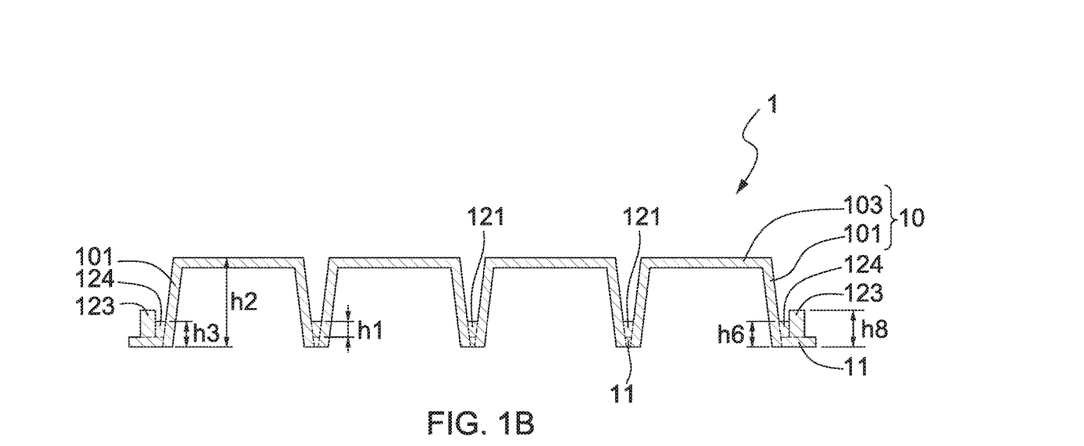
FIG. 1B illustrates a cross-sectional view along a line A-A' in FIG. 1A.
Figure 1C:
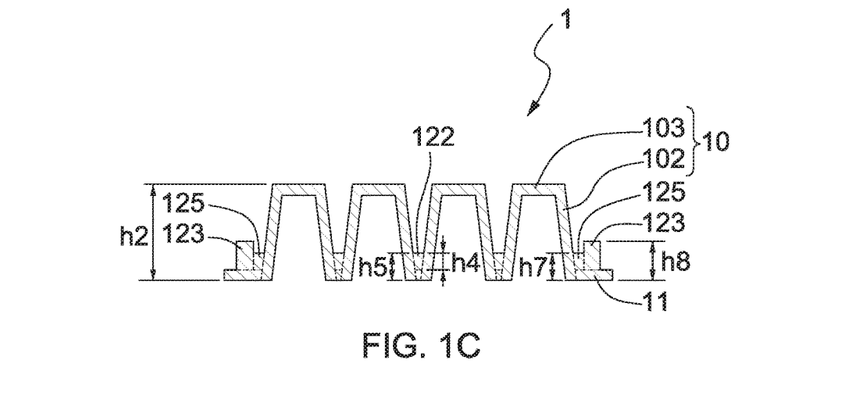
FIG. 1C illustrates a cross-sectional view along a line B-B' in FIG. 1A.

Referring to FIGS. 1A, 1B and 1C, a lid array panel 1 according to an embodiment of the present disclosure is illustrated. The lid array panel 1 is shown in top view in FIG. 1A, cross-sectional view in FIG. 1B along a line A-A' in FIG. 1A, and cross-sectional view in FIG. 1C along the line B-B' in FIG. 1A.

With reference to FIG. 1A, the lid array panel 1 includes lids 10, where each lid 10 includes two opposite first outer side walls 101, two opposite second outer side walls 102 and a top wall 103. The lid array panel 1 further includes a bridge section 11, first inner reinforcements 121, second inner reinforcements 122, outer reinforcements 123, first intermediate reinforcements 124, and second intermediate reinforcements 125. In one or more embodiments, some or all of the components of the lid array panel 1 are connected to and integrated with each other as a monolithic structure.

The lids 10 are connected with each other by the bridge section 11 and arranged regularly in an array (e.g., in parallel rows and parallel columns). For each lid 10 in the lid array panel 1, the first outer side walls 101, the second outer side walls 102 and the top wall 103 together define a cavity within the lid (e.g., as illustrated in FIG. 1B and FIG. 1C).

In one or more embodiments, the first outer side walls 101 and the second outer side walls 102 are beveled outwardly from the top wall 103 to a bottom of the lid 10, to facilitate release of the lid array panel 1 from a mold after injection molding. In one or more embodiments, edges between the top wall 103 and the first outer side walls 101 or the second outer side walls 102 are rounded.

Although, in the embodiment of FIGS. 1A-1C, the top walls 103 of the lids 10 are generally rectangular such that lids 10 each have approximately a rectangular cuboid shape, in other embodiments, the lids 10 may have other approximately cuboid or prismatic shapes, approximately a cylindrical shape, approximately a conical shape, or other shape. In one or more embodiments, a length of the second outer side wall 102 is greater than or equal to a length of the first outer side wall 101.

The bridge section 11 connects the lids 10. As shown in FIG. 1A, the bridge section 11 is attached to the first outer side walls 101 and the second outer side walls 102 of the lids 10 to form a lid array. In one or more embodiments, the bridge section 11 is attached to the first outer side walls 101 and the second outer side walls 102 near or at the bottom of the lids 10, as illustrated in FIG. 1B and FIG. 1C. A thickness of the bridge section 11 is less than or equal to about 0.8 millimeter (mm).

As shown in FIG. 1A, the first inner reinforcements 121 and the second inner reinforcements 122 are arranged between the lids 10, and each first inner reinforcement 121 or second inner reinforcement 122 connects two adjacent lids 10. Two ends of each first inner reinforcement 121 are attached to respective first outer side walls 101 of two adjacent lids 10, and two ends of each second inner reinforcement 122 are attached to respective second outer side walls 102 of two adjacent lids 10.

Referring to FIG. 1A and FIG. 1B, each first inner reinforcements 121 is attached to a top surface of the bridge section 11 between adjacent first outer side walls 101 of two adjacent lids 10. A height h1 of the first inner reinforcement 121 is less than a height h2 of the lid 10, and the first inner reinforcement 121 does not extend to the top wall 103 of the lid 10. Additionally, as shown in FIG. 1B, a combined height h3 of the bridge section 11 and the first inner reinforcement 121 disposed thereon is less than the height h2 of the lid 10.

Referring to FIG. 1A and FIG. 1C, each second inner reinforcement 122 is attached to the top surface of the bridge section 11 between adjacent second outer side walls 102 of two adjacent lids 10. A height h4 of the second inner reinforcement 122 is less than the height h2 of the lid 10, and the second inner reinforcement 122 does not extend to the top wall 103 of the lid 10. Additionally, as shown in FIG. 1C, a combined height h5 of the bridge section 11 and the second inner reinforcement 122 disposed thereon is less than the height h2 of the lid 10.

In one or more embodiments, the height h2 of the lid 10 is greater than or equal to 2 mm.

Referring to FIGS. 1A-1C, four outer reinforcements 123 are attached to the top surface of the bridge section 11 around a periphery of the lid array. In one or more embodiments, two or more of the outer reinforcements 123 are connected to and integrated with each other as a monolithic structure. In some embodiments, all of the outer reinforcements 123 are connected to and integrated with each other as a monolithic structure. In the embodiment shown in FIGS. 1A-1C, two of the outer reinforcements 123 are arranged substantially parallel to the first outer side walls 101 of the lids 10 (e.g., in a "column" direction of the lid array) and two of the outer reinforcements 123 are arranged substantially parallel to the second outer side walls 102 of the lids 10 (e.g., in a "row" direction of the lid array). In one or more embodiments, side walls of the outer reinforcements 123 are beveled outwardly from a top to a bottom thereof, to facilitate release of the lid array panel 1 from a mold after injection molding.

As shown in FIG. 1B and FIG. 1C respectively, the first intermediate reinforcements 124 and the second intermediate reinforcements 125 are attached to the top surface of the bridge section 11.

Referring to FIG. 1A and FIG. 1B, the first intermediate reinforcements 124 are arranged between and connect the lids 10 and the outer reinforcements 123; for each first intermediate reinforcement 124, one end of the first intermediate reinforcement 124 is attached to the first outer side wall 101 of the lid 10 and another end is attached to the outer reinforcement 123.

Referring to FIG. 1A and FIG. 1C, the second intermediate reinforcements 125 are arranged between and connect the lids 10 and the outer reinforcements 123; for each second intermediate reinforcement 125, one end of the second intermediate reinforcement 125 is attached to the second outer side wall 102 of the lid 10 and another end is attached to the outer reinforcement 123.

A total height h6 of the bridge section 11 and the first intermediate reinforcements 124 disposed thereon is less than the height h2 of the lid 10, and a total height h7 of the bridge section 11 and the second intermediate reinforcements 125 is less than the height h2 of the lid 10. Additionally, the height h6 and the height h7 are each less than a total height h8 of the bridge section 11 and the outer reinforcement 123 disposed thereon. In one or more embodiments, side walls of the first intermediate reinforcements 124 or the second intermediate reinforcements 125 are beveled outwardly from a top to a bottom thereof to facilitate release of the lid array panel 1 after injection molding. In addition, beveling can reduce burr formation in a subsequent singulation stage, as illustrated and described with respect to FIG. 11E.

The first inner reinforcements 121, the second inner reinforcements 122, the outer reinforcements 123, the first intermediate reinforcements 124 and the second intermediate reinforcements 125 are used to enhance strength between the lids 10 such that warpage of the lid array panel 1 can be reduced. For example, the outer reinforcements 123 can enhance the structural strength of the entire lid array panel 1; and the first inner reinforcements 121, the second inner reinforcements 122, the first intermediate reinforcements 124 and the second intermediate reinforcements 125 can avoid deformation of the lid array panel 1 caused from stress concentration. Additionally, the first inner reinforcements 121, the outer reinforcements 123 that are parallel to the second outer side walls 102 of the lids 10, and the first intermediate reinforcements 124 can provide latitudinal reinforcement of the lid array panel 1 (e.g., in the row direction); and the second inner reinforcements 122, the outer reinforcements 123 that are parallel to the first outer side walls 101 of the lids 10, and the second intermediate reinforcements 125 can provide longitudinal reinforcement of the lid array panel 1 (e.g., in the column direction).

Other arrangements of the first inner reinforcements 121, the second inner reinforcements 122, the outer reinforcements 123, the first intermediate reinforcements 124 and the second intermediate reinforcements 125 are contemplated for various embodiments to achieve strength enhancement and the ease of subsequent processes (such as singulation).

Figure 2:
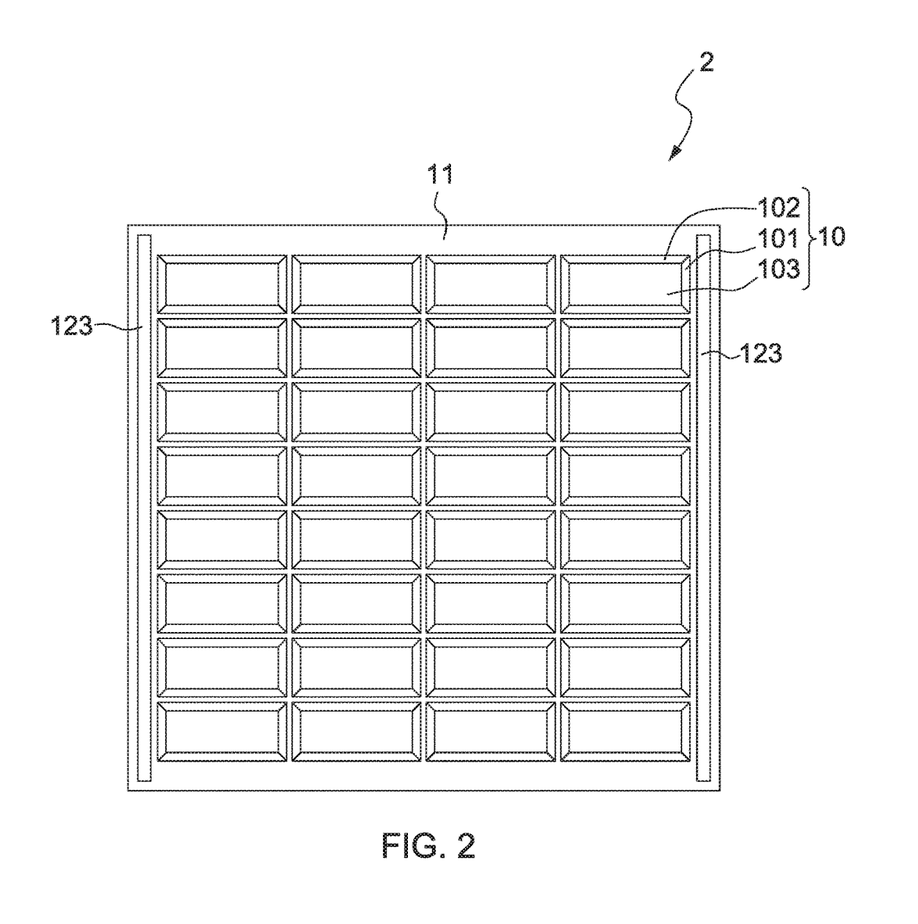
FIG. 2 illustrates a top view of a lid array panel according to an embodiment the present disclosure.

FIG. 2 is a top view of a lid array panel 2 according to an embodiment of the present disclosure. In FIG. 2, lids 10 (with first outer side walls 101, second outer side walls 102, and top walls 103), a bridge section 11, and outer reinforcements 123 are as described with respect to the same numbered components of FIG. 1A. As compared to the lid array panel 1 in FIG. 1A, the lid array panel 2 includes outer reinforcements 123 parallel to the first sidewalls 101 of the lids 10, and omits outer reinforcements 123 parallel to the second sidewalls 102 of the lids 10. Further, the embodiment of FIG. 2 omits inner reinforcements and intermediate reinforcements (e.g., such as the first inner reinforcements 121, the second inner reinforcements 122, the first intermediate reinforcements 124 and the second intermediate reinforcements 125 in FIG. 1A). The design illustrated in FIG. 2 enhances a longitudinal strength of the lid array panel 2.

As noted above, the lid array panel 1 is formed by injection molding. To form the lid array panel 1, the mold can include multiple molding cavities, and multiple runners arranged between the molding cavities. The molding cavities can be used to generate the lid 10 and the outer reinforcements 123, and the runners can be used to generate the first inner reinforcements 121, the second inner reinforcements 122, the first intermediate reinforcements 124 and/or the second intermediate reinforcements 125. In addition, the runners of the mold also can be used for enhancing injection molding while forming the lid array panel 1.

Figure 3:
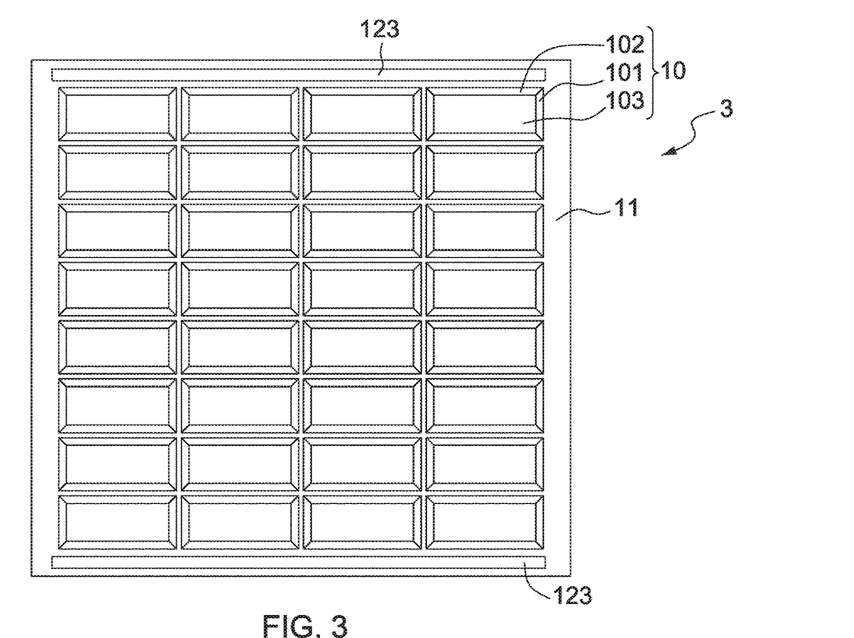
FIG. 3 illustrates a top view of a lid array panel according to an embodiment the present disclosure.

FIG. 3 is a top view of a lid array panel 3 according to an embodiment of the present disclosure. In FIG. 3, lids 10 (with first outer side walls 101, second outer side walls 102, and top walls 103), a bridge section 11, and outer reinforcements 123 are as described with respect to the same numbered components of FIG. 1A. As compared to the lid array panel 1 in FIG. 1A, the lid array panel 3 includes outer reinforcements 123 parallel to the second sidewalls 102 of the lids 10, and omits outer reinforcements 123 parallel to the first sidewalls 101 of the lids 10. Further, the embodiment of FIG. 3 omits inner reinforcements and intermediate reinforcements (e.g., such as the first inner reinforcements 121, the second inner reinforcements 122, the first intermediate reinforcements 124 and the second intermediate reinforcements 125 in FIG. 1A). The design illustrated in FIG. 3 enhances a latitudinal strength of the lid array panel 3.

Figure 4:
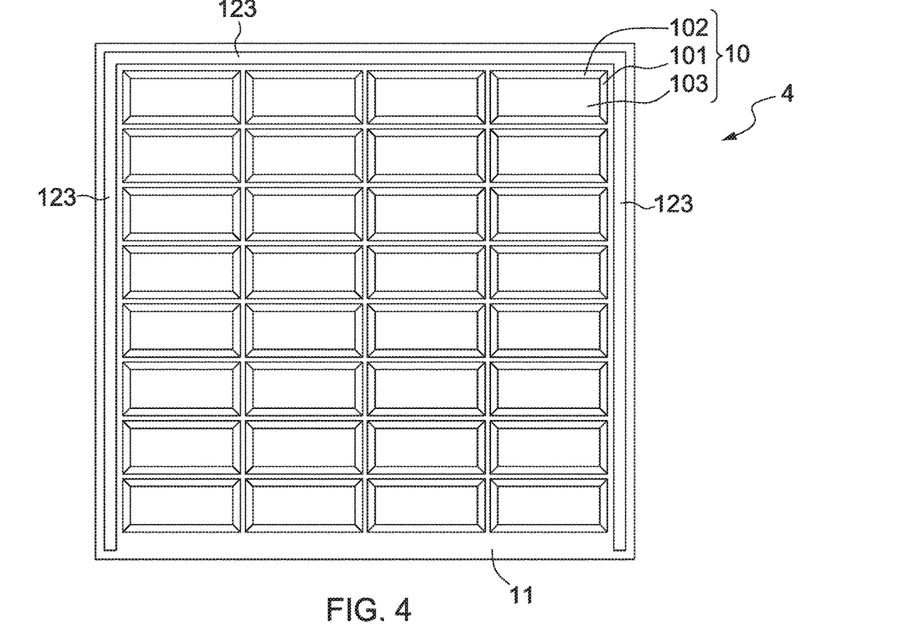
FIG. 4 illustrates a top view of a lid array panel according to an embodiment the present disclosure.

FIG. 4 is a top view of a lid array panel 4 according to an embodiment of the present disclosure. In FIG. 4, lids 10 (with first outer side walls 101, second outer side walls 102, and top walls 103), a bridge section 11, and outer reinforcements 123 are as described with respect to the same numbered components of FIG. 1A. As compared to the lid array panel 1 in FIG. 1A, the lid array panel 4 includes one outer reinforcement 123 parallel to the second sidewalls 102 of the lids 10 on one side of the lid array panel 4, along with two outer reinforcements 123 parallel to the first sidewalls 101 of the lids 10 (on two sides of the lid array panel 4). The embodiment of FIG. 4 omits a fourth outer reinforcement 123 (e.g., as illustrated in FIG. 1A), and further omits inner reinforcements and intermediate reinforcements (e.g., such as the first inner reinforcements 121, the second inner reinforcements 122, the first intermediate reinforcements 124 and the second intermediate reinforcements 125 in FIG. 1A). The design illustrated in FIG. 4 is beneficial in a subsequent singulation stage, because there are fewer components in the path of the singulating tool as compared the lid array panel 1, while enhancing both a longitudinal strength and a latitudinal strength of the lid array panel 4.

Figure 5:
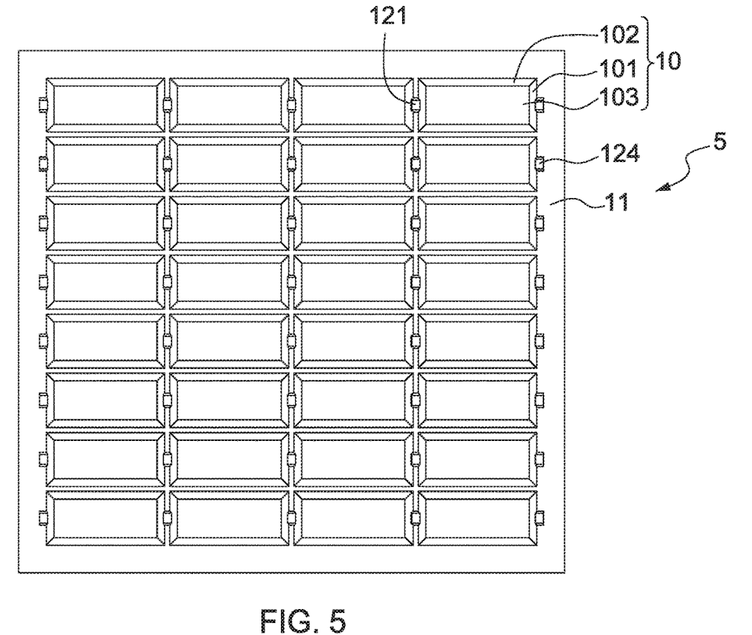
FIG. 5 illustrates a top view of a lid array panel according to an embodiment the present disclosure.

FIG. 5 is a top view of a lid array panel 5 according to an embodiment of the present disclosure. The lid array panel 5 is similar to the lid array panel 1 of FIG. 1A, a difference being that the lid array panel 5 omits the second inner reinforcements 122, the outer reinforcements 123 and the second intermediate reinforcements 125. In one or more embodiments, the first intermediate reinforcements 124 are further omitted. The design illustrated in FIG. 5 enhances a latitudinal strength of the lid array panel 5.

Figure 6:
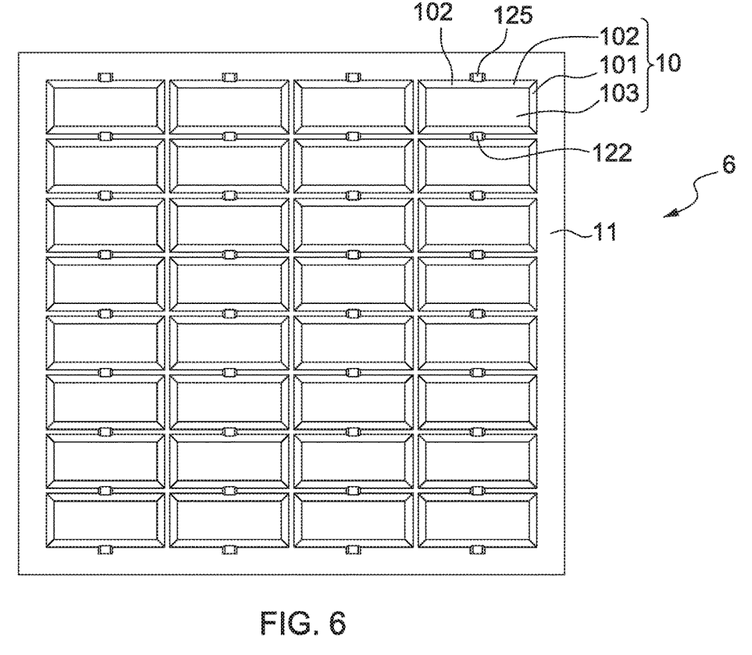
FIG. 6 illustrates a top view of a lid array panel according to an embodiment the present disclosure.

FIG. 6 is a top view of a lid array panel 6 according to an embodiment of the present disclosure. The lid array panel 6 is similar to the lid array panel 1 of FIG. 1A, a difference being that the lid array panel 6 omits the first inner reinforcements 121, the outer reinforcements 123 and the first intermediate reinforcements 124. In one or more embodiments, the second intermediate reinforcements 125 are further omitted. The design illustrated in FIG. 6 enhances a longitudinal strength of the lid array panel 6.

Figure 7:
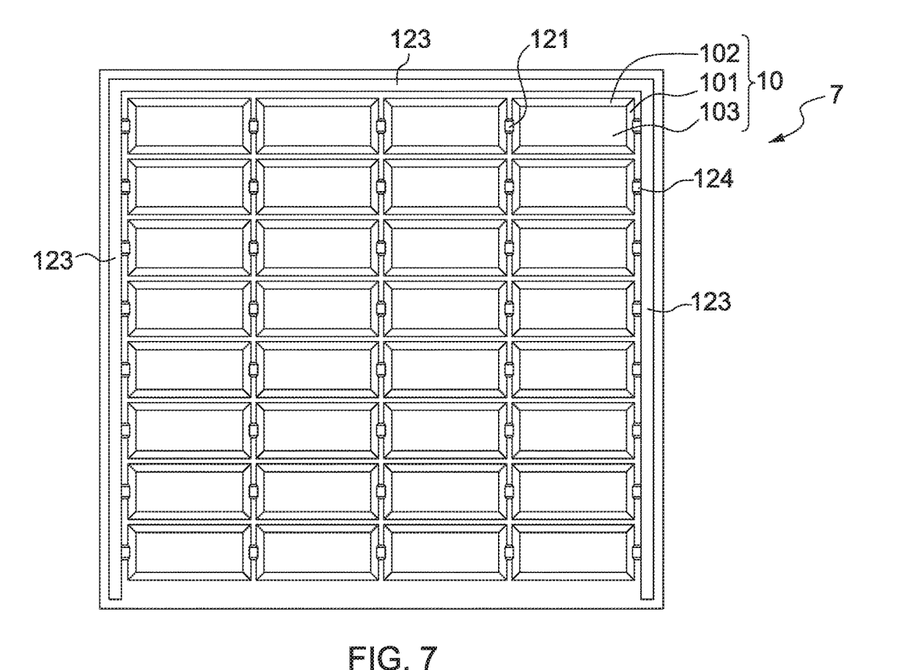
FIG. 7 illustrates a top view of a lid array panel according to an embodiment the present disclosure.

FIG. 7 is a top view of a lid array panel 7 according to an embodiment of the present disclosure. The lid array panel 7 is similar to the lid array panel 1 of FIG. 1A, a difference being that the lid array panel 7 omits the second inner reinforcements 122 and the second intermediate reinforcements 125. The design illustrated in FIG. 7 enhances a latitudinal and a longitudinal strength of the lid array panel 7. Although the omitted second inner reinforcements 122 and second intermediate reinforcements 125 can enhance an overall strength of the lid array panel 7, the omission of the second inner reinforcements 122 and the second intermediate reinforcements 125 is beneficial in a subsequent singulation stage, because there are fewer components in the path of the singulating tool as compared to the lid array panel 1.

Figure 8:
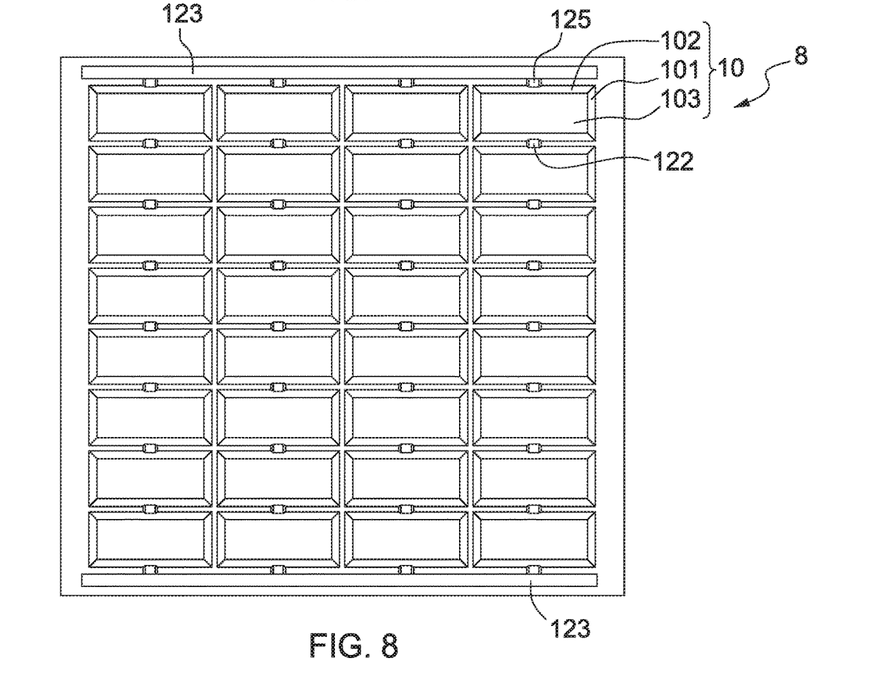
FIG. 8 illustrates a top view of a lid array panel according to an embodiment the present disclosure.

FIG. 8 is a top view of a lid array panel 8 according to an embodiment of the present disclosure. The lid array panel 8 is similar to the lid array panel 1 of FIG. 1A, a difference being that the lid array panel 8 omits the first inner reinforcements 121 and the first intermediate reinforcements 124. The design illustrated in FIG. 8 enhances a latitudinal and a longitudinal strength of the lid array panel 7. Although the omitted first inner reinforcements 121 and first intermediate reinforcements 124 can enhance an overall strength of the lid array panel 8, the omission of the first inner reinforcements 121 and first intermediate reinforcements 124 is beneficial in a subsequent singulation stage, because there are fewer components in the path of the singulating tool as compared to the lid array panel 1.

FIGS. 9A-9E illustrate an embodiment of a process of making a package structure including the lid array panel 1 as shown in FIGS. 1A and 1B.

Figure 9A:
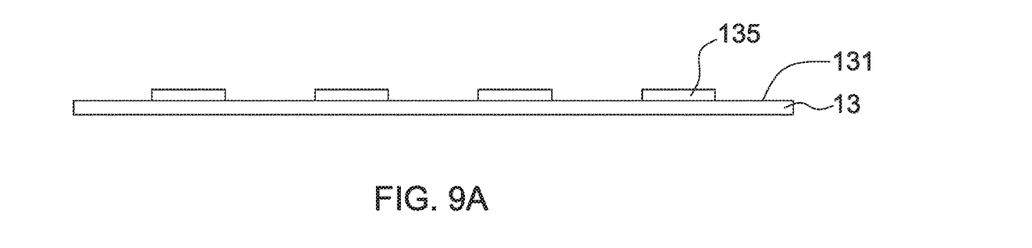
FIG. 9A, FIG. 9B, FIG. 9C, FIG. 9D and FIG. 9E illustrate a manufacturing process of a package structure according to an embodiment the present disclosure.

Referring to FIG. 9A, chips 135 (whose number corresponds to a number of lids 10 of the lid array panel 1) are disposed on an upper surface 131 of a carrier 13. Although not shown in FIG. 9A, the chips 135 are electrically connected (e.g., by wire bonding or flip chip bonding) to corresponding pads or other electronic devices disposed within or on the carrier 13.

Figure 9B:
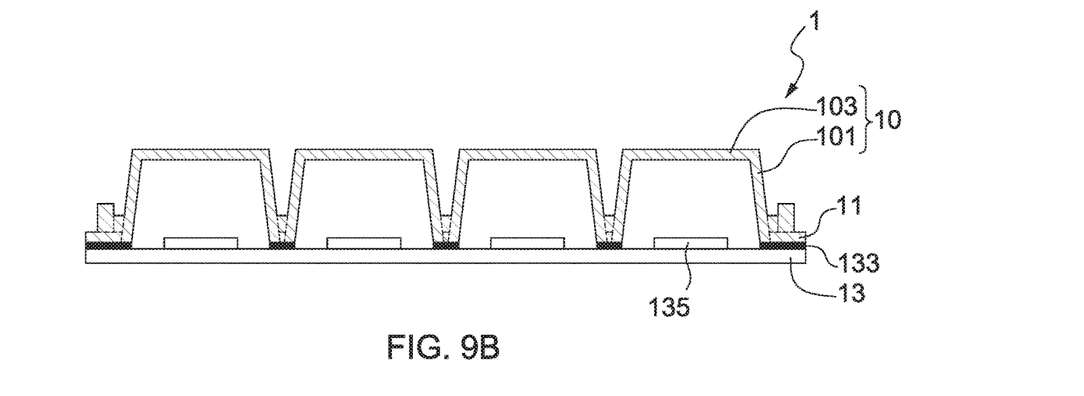

Referring to FIG. 9B, an adhesive 133 is coated on either or both of the bottom of lids 10 of the lid array panel 1 or on the upper surface 131 of the carrier 13. Then, the lid array panel 1 is affixed to the upper surface 131 of the carrier 13 by the adhesive 133. The lid array panel 1 is positioned such that each lid 10 covers a respective chip 135.

Figure 9C:
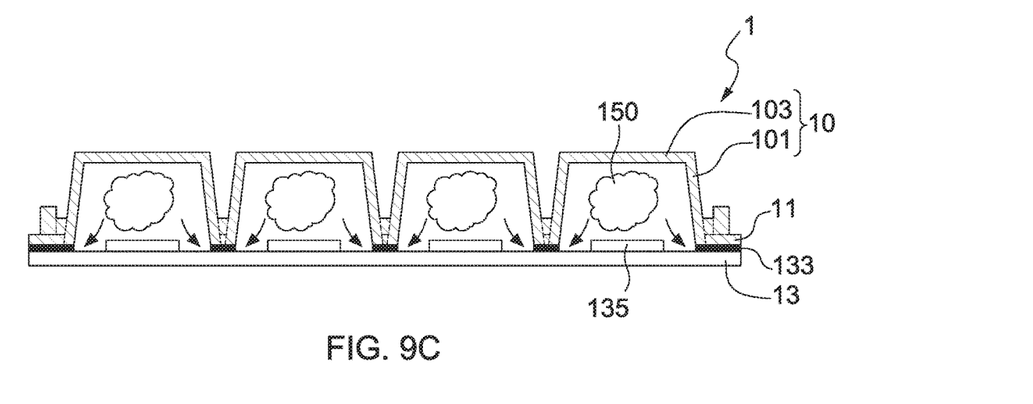

Referring to FIG. 9C, the adhesive 133 is cured, for example, by heating at an elevated temperature for a sufficient time. Air 150 within a cavity formed by the lid 10 and the carrier 13 expands.

Figure 9D:
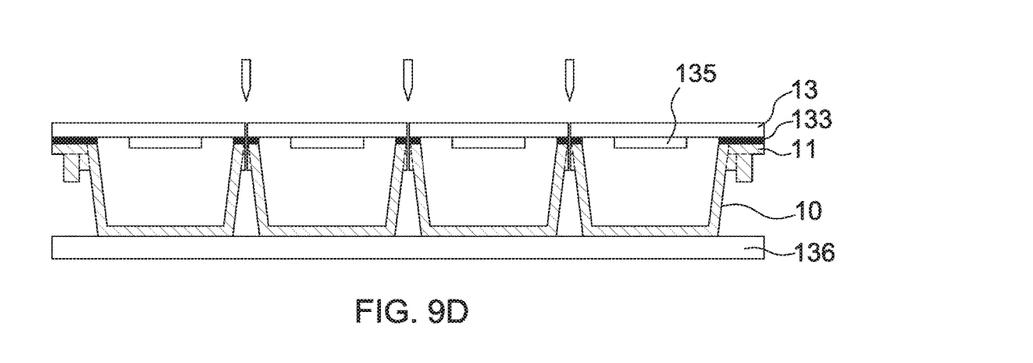

Referring to FIG. 9D, the carrier 13 with the lid array panel 1 affixed is turned upside down and the lids 10 are attached to a tape 136. A cutting tool is used to cut through the carrier 13, the adhesive 133, the bridge section 11, and reinforcements (e.g., the first inner reinforcements 121, the second inner reinforcements 122, the first intermediate reinforcements 124 or the second intermediate reinforcements 125). During the cutting, sawing water is applied.

Figure 9E:
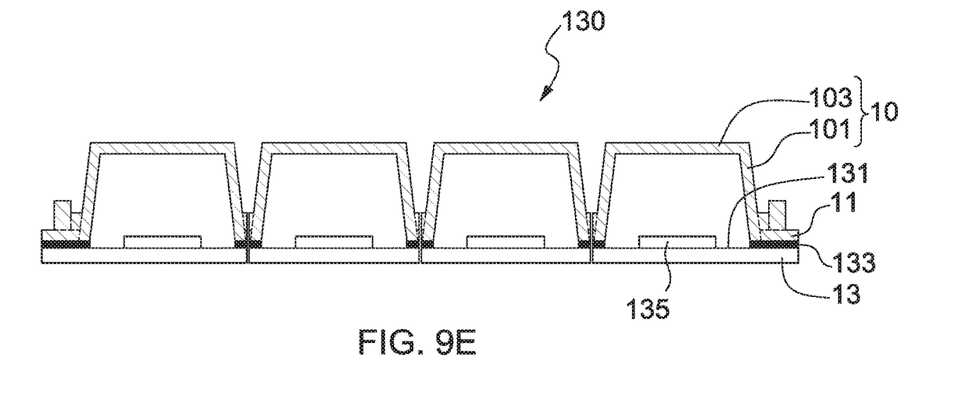

Referring to FIG. 9E, the tape 136 is removed, resulting in multiple individual package structures 130.

Figure 10:
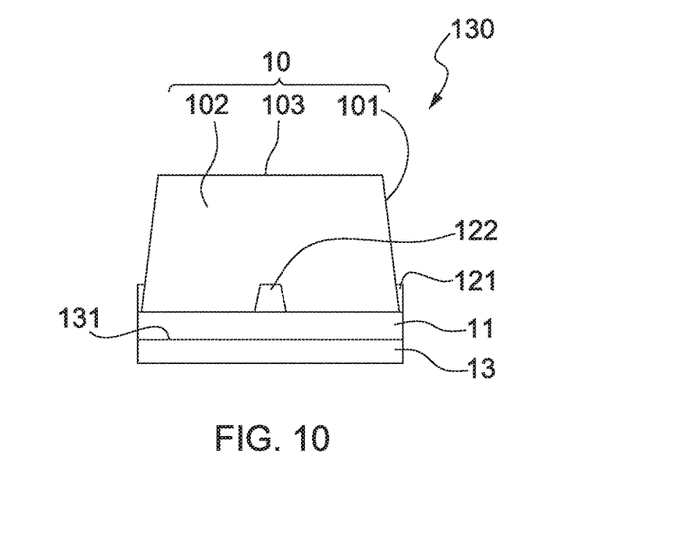
FIG. 10 illustrates a package structure according to an embodiment the present disclosure.

FIG. 10 is an illustration of a side view of an individual package structure 130. The lid 10 is arranged on the carrier 13. The first outer side walls 101 and the second outer side walls 102 are angled or beveled outwardly from a top to a bottom of the lid 10. The bridge section 11 is attached to lower portions of the first outer side walls 101 and the second outer side walls 102. A side wall of the bridge section 11 is substantially perpendicular to the upper surface 131 of the carrier 13. A side wall of the bridge section 11 and a side wall of the first inner reinforcement 121 are substantially coplanar. The first inner reinforcements 121 (or the first intermediate inner reinforcements 124) and the second inner reinforcements 122 (or the second intermediate reinforcements 125) are disposed on the bridge section 11 and are attached to the lid 10: the first inner reinforcements 121 (or the first intermediate reinforcements 124) are attached to the first outer side wall 101 while the second inner reinforcements 122 (or the second intermediate reinforcements 125) are attached to the second outer side wall 102. Further, inner side walls of the first inner reinforcements 121 (or the first intermediate reinforcements 124), and the second inner reinforcements 122 (or the second intermediate reinforcements 125) are sloped to match the angle or bevel of the corresponding first outer side walls 101 and the second outer side walls 102.

As noted with respect to FIG. 9C, air 150 within the cavity defined by the lid 10 and the carrier 13 will expand while curing the adhesive 133. The heated and expanded air may escape between the lid 10 and the carrier 13, resulting in voids forming in the adhesive 133. Sawing water could enter the cavity defined by the lid 10 and the carrier 13 during singulation through the voids, which could negatively affect a quality of the package structure 130.

FIGS. 11A-11H illustrate an embodiment of a process of making a package structure including the lid array panel 1 of FIG. 1A, where voids in the adhesive 133 are avoided.

Figure 11A:
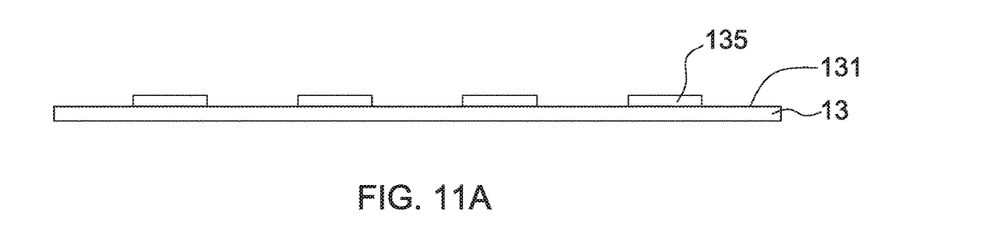
FIG. 11A, FIG. 11B, FIG. 11C, FIG. 11D, FIG. 11E, FIG. 11F, FIG. 11G and FIG. 11H illustrate a manufacturing process of a package structure according to an embodiment the present disclosure.

Referring to FIG. 11A, chips 135 (whose number corresponds to the number of lids 10 of the lid array panel 1) are disposed on an upper surface 131 of a carrier 13. Although not shown in FIG. 11A, the chips 135 are electrically connected (e.g., by wire bonding or flip chip bonding) to corresponding pads or other electronic devices disposed within or on the carrier 13.

Figure 11B:
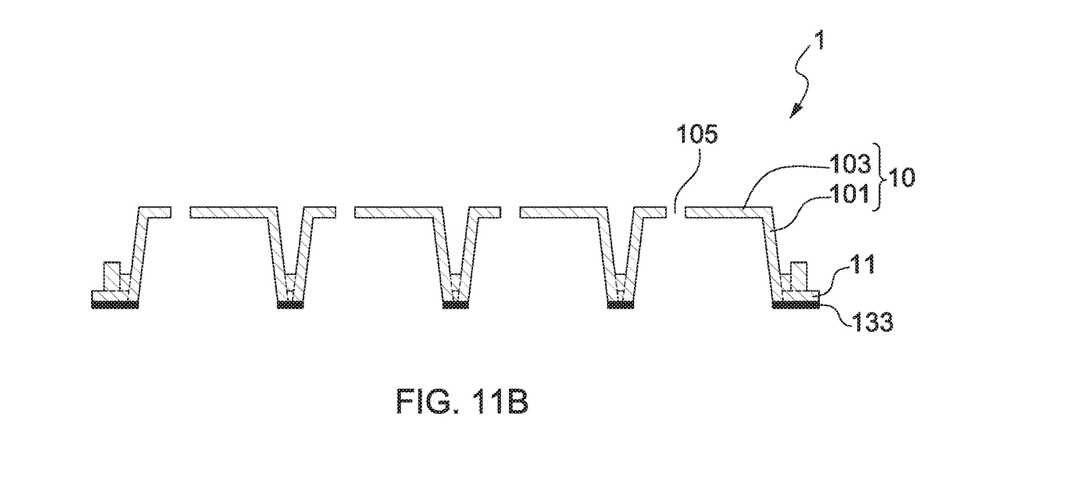

Referring to FIG. 11B, a through hole 105 is formed in the top wall 103 of each lid 10 of the lid array panel 1. An adhesive 133 is coated on either or both of the bottom of lids 10 of the lid array panel 1 or on the upper surface 131 of the carrier 13.

Figure 11C:
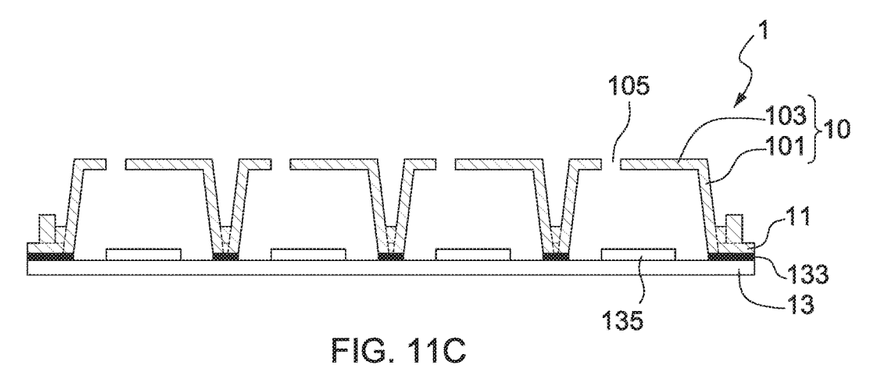

Referring to FIG. 11C, the lid array panel 1 is affixed to the upper surface 131 of the carrier 13 by the adhesive 133. The lid array panel 1 is positioned such that each lid 10 covers a respective chip 135. The adhesive 133 is cured, for example, by heating at an elevated temperature for a sufficient time. During the curing of the adhesive 133, air in the cavity defined by the lid 10 and the carrier 13 heats and expands, and escapes by way of the through holes 105. Therefore, formation of voids in the adhesive 133 is reduced.

Figure 11D:
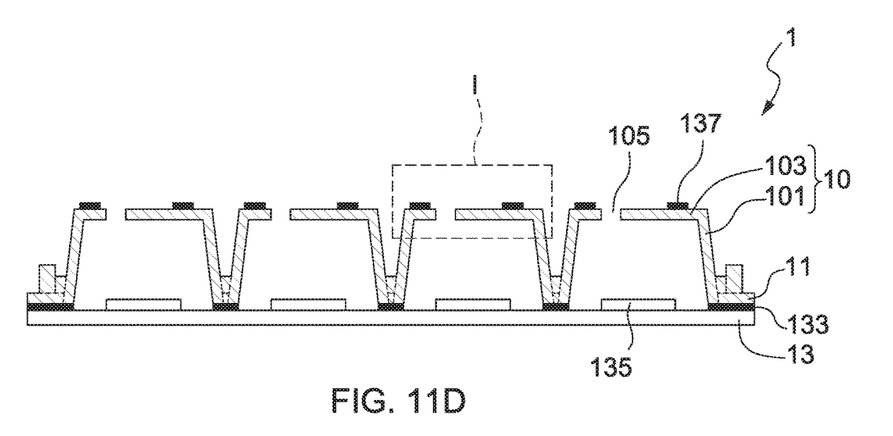

Referring to FIG. 11D, an adhesive 137 is selectively coated on the top wall 103 of the lids 10 of the lid array panel 1. In some embodiments, the adhesive 137 partially covers the top wall 103 and partially exposes the top wall 103.

Figure 11E:
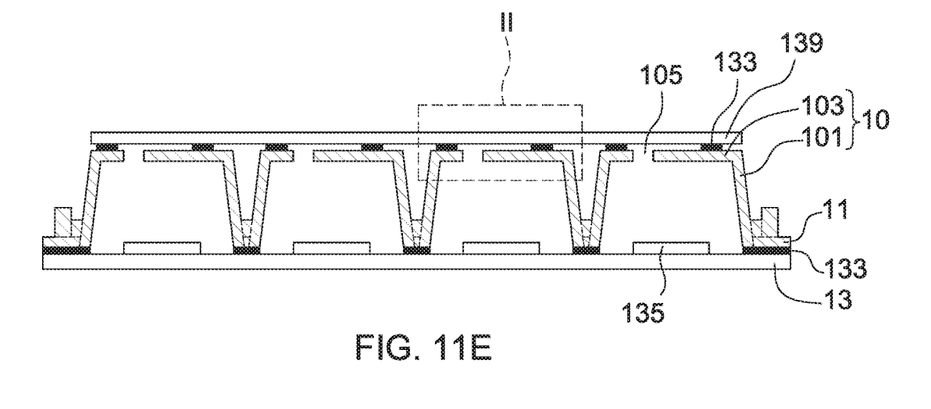

Referring to FIG. 11E, an addition film 139 such as a colorless film (e.g., a polyimide (PI) film or a glass) or a diffuser film is applied to a top of the lid array panel 1 and is attached to the lid array panel 1 by the adhesive 137 so as to cover the through holes 105 in the lids 10. Next, the adhesive 137 is cured, such as by heating. After curing the adhesive 137, the film 139 is affixed to the top of the lid 10.

Figure 12A:
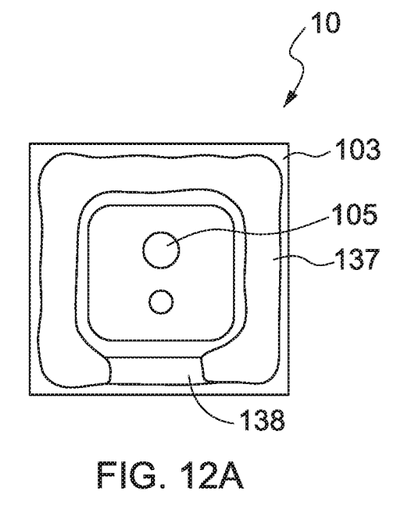
FIG. 12A is an enlarged top view of a portion "I" in FIG. 11D.
Figure 12B:
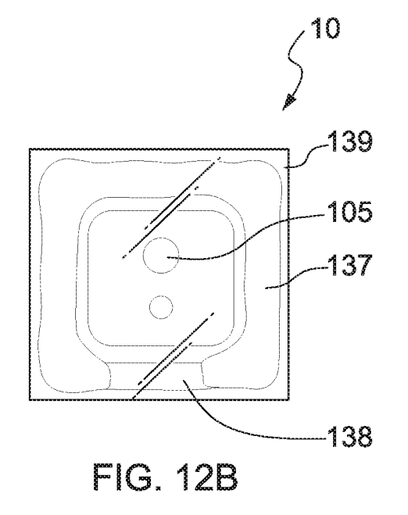
FIG. 12B is an enlarged top view of a portion "II" in FIG. 11E.

As will become evident from FIGS. 12A and 12B, there is a gap between the lid 10 and the film 139 at a portion of the lid 10 exposed by the adhesive 137. That is, the adhesive 137 defines a gap extending from the lid 10 to the film 139. Air within the cavities of the lid array panel 1 escapes by way of the through hole 105 and the gap.

Figure 11F:
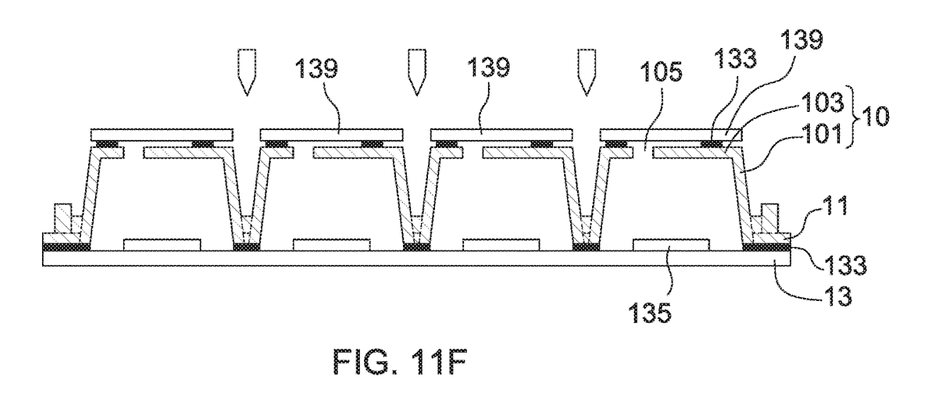

Referring to FIG. 11F, a cutting tool is used to cut the film 139 such that each lid 10 of the lid array panel 1 has a piece of the film 139 attached.

Figure 11G:
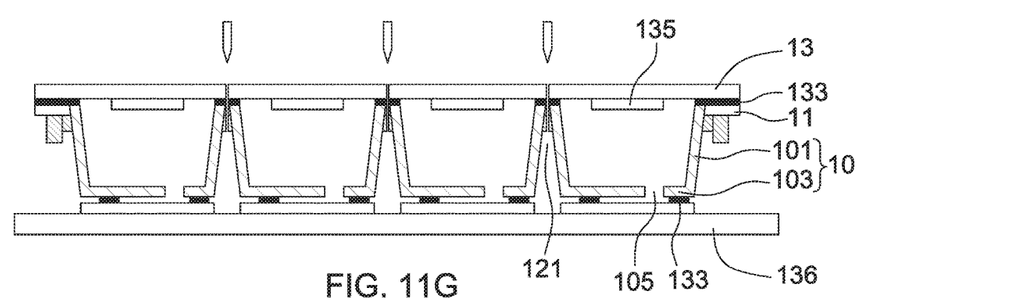

Referring to FIG. 11G, the film 139 is attached to a tape 136. A cutting tool is used to cut through the carrier 13, the adhesive 133, the bridge section 11, and reinforcements (e.g., the first inner reinforcements 121, the second inner reinforcements 122, the first intermediate reinforcements 124 or the second intermediate reinforcements 125). During cutting, sawing water may be applied to the lid array panel 1 and the carrier 13. Although some of the sawing water may flow into the cavities through the gaps and the through holes 105, the water can be removed; for example, by a baking or heating process to remove moisture.

Figure 11H:
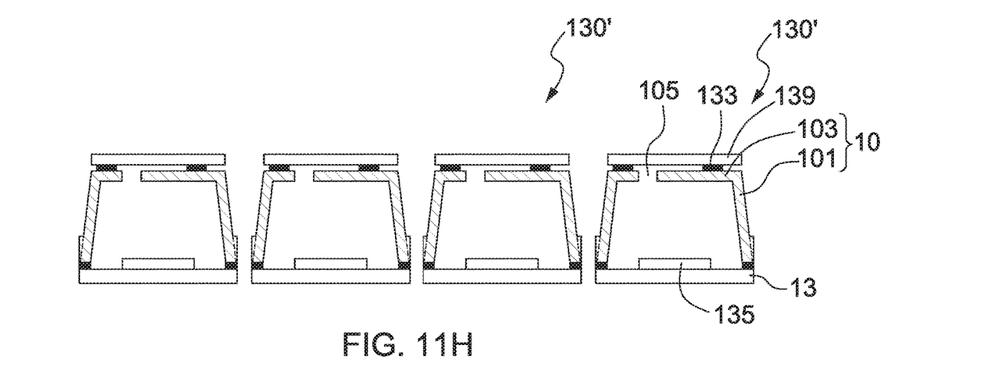

Referring to FIG. 11H, the tape 136 is removed, resulting in multiple individual package structures 130'.

FIG. 12A illustrates a top view of the lid 10 following the process stage of FIG. 11D according to an embodiment of the present disclosure (FIG. 12A is an enlarged top view of portion "I" in FIG. 11D). The adhesive 137 is shown disposed around much of a periphery of the top wall 103 of the lid 10, leaving a portion of the top wall 103 exposed at a gap 138.

FIG. 12B illustrates a top view of the lid 10 following the process stage of FIG. 11E according to an embodiment of the present disclosure (FIG. 12B is an enlarged top view of portion "II" in FIG. 11E). In the illustrated embodiment, the film 139 is translucent or transparent. The gap 138 extends to the film 139.

As used herein, the terms "substantially," "substantial," "approximately" and "about" are used to describe and account for small variations. When used in conjunction with an event or circumstance, the terms can encompass instances in which the event or circumstance occurs precisely as well as instances in which the event or circumstance occurs to a close approximation. For example, when used in conjunction with a numerical value, the terms can encompass a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%.

Two surfaces can be deemed to be coplanar or substantially coplanar if a displacement between the two surfaces is no greater than 5 μm, no greater than 2 μm, no greater than 1 μm, or no greater than 0.5 μm.

The term "substantially perpendicular" referring to two components can refer to a range of variation of less than or equal to ±10° of 90° between the two components, such as less than or equal to ±5°, less than or equal to ±3°, less than or equal to ±2°, or less than or equal to ±1°. The term "substantially parallel" referring to two components (each component laying along one of a line or a plane) can refer to an angular displacement between the two components being less than or equal to 10°, such as less than or equal to 5°, less than or equal to 3°, less than or equal to 2°, or less than or equal to 1°.

While the present disclosure has been described and illustrated with reference to specific embodiments thereof, these descriptions and illustrations are not limiting. It should be understood by those skilled in the art that various changes may be made and equivalents may be substituted without departing from the true spirit and scope of the present disclosure as defined by the appended claims. The illustrations may not necessarily be drawn to scale. There may be distinctions between the artistic renditions in the present disclosure and the actual apparatus due to manufacturing processes and tolerances. There may be other embodiments of the present disclosure which are not specifically illustrated. The specification and the drawings are to be regarded as illustrative rather than restrictive. Modifications may be made to adapt a particular situation, material, composition of matter, method, or process to the objective, spirit and scope of the present disclosure. All such modifications are intended to be within the scope of the claims appended hereto. While the methods disclosed herein have been described with reference to particular operations performed in a particular order, it will be understood that these operations may be combined, sub-divided, or re-ordered to form an equivalent method without departing from the teachings of the present disclosure. Accordingly, unless specifically indicated herein, the order and grouping of the operations are not limitations.

What is claimed is:

1. A lid array panel, comprising:
a plurality of lids, wherein each lid includes at least one outer side wall, the outer side wall comprising a lateral surface;
a bridge section surrounding and attached to the lateral surfaces of the outer side walls of the lids, wherein the lids are connected to each other by the bridge section; and
at least one reinforcement directly attached to the bridge section.

2. The lid array panel according to claim 1, wherein the bridge section is attached to the outer side walls of the lids near or at a bottom of the lids.

3. The lid array panel according to claim 1, wherein:
each lid comprises one first outer side wall and one second outer side wall, and a length of the second outer side wall of each lid is equal to or greater than a length of the first outer side wall of each lid; and
the at least one reinforcement comprises an inner reinforcement disposed between two adjacent lids of the plurality of lids, one end of the inner reinforcement being attached to the first outer side wall of a first one of the two adjacent lids and another end of the inner reinforcement being attached to the first outer side wall of a second one of the two adjacent lids.

4. The lid array panel according to claim 1, wherein:
each lid comprises one first outer side wall and one second outer side wall, and a length of the second outer side wall of each lid is equal to or greater than a length of the first outer side wall of each lid; and
the at least one reinforcement comprises an inner reinforcement disposed between two adjacent lids of the plurality of lids, one end of the inner reinforcement being attached to the second outer side wall of a first one of the two adjacent lids and another end of the inner reinforcement being attached to the second one outer side wall of a second of the two adjacent lids.

5. The lid array panel according to claim 1, wherein the reinforcement comprises an outer reinforcement arranged around a portion of a periphery of the lid array panel.

6. The lid array panel according to claim 5, wherein the outer reinforcement extends around the entire periphery of the lid array panel.

7. The lid array panel according to claim 5, wherein the reinforcement further comprises an intermediate reinforcement, one end of the intermediate reinforcement connects to the outer side wall of a lid of the plurality of lids, and another end of the intermediate reinforcement connects to the outer reinforcement.

8. The lid array panel according to claim 1, wherein the outer side walls of the lids are beveled.

9. A package structure, comprising:
a carrier;
a chip disposed on an upper surface of the carrier;
a lid comprising a top wall and an outer side wall, the outer side wall comprising a lateral surface, the top wall and the outer side wall of the lid together defining a cavity, wherein the outer side wall of the lid is attached to the upper surface of the carrier;
a bridge section surrounding and attached to the lateral surface of the outer side wall of the lid; and
a reinforcement directly attached to the bridge section.

10. The package structure according to claim 9, wherein a side wall of the bridge section is substantially perpendicular to the upper surface of the carrier.

11. The package structure according to claim 9, further comprising an adhesive and a film attached to the top wall of the lid by the adhesive, wherein the adhesive defines a gap extending between the top wall of the lid and the film, and the top wall defines a through hole.

12. The package structure according to claim 9, wherein a side wall of the bridge section and a side wall of the reinforcement are coplanar.

13. A method of making a package structure, comprising:
providing a lid array panel, wherein the lid array panel comprises:
a plurality of lids, wherein each lid comprises at least one outer side wall, the outer side wall comprising a lateral surface;
a bridge section surrounding and attached to the lateral surfaces of the outer side walls of the lids, wherein the lids are connected to each other by the bridge section; and
a reinforcement directly attached to the bridge section;
providing a carrier comprising a plurality of chips disposed at a surface of the carrier,
attaching the lid array panel to the surface of the carrier such that each chip is covered by a corresponding lid and each lid defines a cavity with the carrier; and
forming a plurality of package structures by singulation.

14. The method according to claim 13, wherein the singulation comprises cutting through the bridge section and the reinforcement.

15. The method according to claim 13, wherein attaching the lid array panel to the surface of the carrier comprises disposing an adhesive between the outer side walls of the lids and the upper surface of the carrier, positioning the lid array panel on the surface of the carrier, and curing the adhesive.

16. The method according to claim 13, wherein each lid defines a through hole in a top wall of the lid.

17. The method according to claim 16, further comprising disposing an adhesive on a portion of a periphery of the top wall of each lid; attaching a film over the top walls of the lids and on the adhesive, and curing the adhesive.

18. The method according to claim 17, further comprising cutting through the bridge section, the reinforcement, and the film.

19. The method according to claim 18, wherein cutting through the film is performed prior to cutting through the bridge section and the reinforcement.

20. The method according to claim 18, further comprising, subsequent to cutting, heating to remove moisture.

21. The lid array panel of claim 1, wherein the at least one reinforcement includes a first reinforcement and a second reinforcement, the first reinforcement reinforces the lid array panel in a latitudinal direction, and the second reinforcement reinforces the lid array panel in a longitudinal direction.

22. The lid array panel of claim 1, wherein the at least one reinforcement enhances a strength between the plurality of lids such that a warpage of the lid array panel is reduced.

* * * * *